（12）United States Patent
Willmeroth et al.

(10) Patent No.: US 10,128,367 B2
(45) Date of Patent: Nov. 13, 2018

(54) TRANSISTOR DEVICE WITH INCREASED GATE-DRAIN CAPACITANCE

(71) Applicant: Infineon Technologies Austria AG, Villach (AT)

(72) Inventors: Armin Willmeroth, Friedberg (DE); Ahmed Mahmoud, Munich (DE); Enrique Vecino Vazquez, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/363,994

(22) Filed: Nov. 29, 2016

(65) Prior Publication Data

US 2017/0154992 A1    Jun. 1, 2017

(30) Foreign Application Priority Data

Nov. 30, 2015   (DE) .................. 10 2015 120 747

(51) Int. Cl.

| *H01L 29/94* | (2006.01) |
|---|---|
| *H01L 29/78* | (2006.01) |
| *H01L 29/06* | (2006.01) |
| *H01L 29/36* | (2006.01) |
| *H01L 29/423* | (2006.01) |
| *H01L 23/485* | (2006.01) |
| *H01L 29/417* | (2006.01) |
| *H01L 29/08* | (2006.01) |

(52) U.S. Cl.
CPC ........ *H01L 29/7811* (2013.01); *H01L 23/485* (2013.01); *H01L 29/0619* (2013.01); *H01L 29/36* (2013.01); *H01L 29/4236* (2013.01); *H01L 29/7813* (2013.01); *H01L 29/0634* (2013.01); *H01L 29/0696* (2013.01); *H01L 29/0878* (2013.01); *H01L 29/41766* (2013.01); *H01L 2224/0603* (2013.01)

(58) Field of Classification Search
CPC ............ H01L 29/0634; H01L 29/0696; H01L 29/41766; H01L 29/7811; H01L 29/7813
USPC ................................ 257/331, 333, 340, 342
See application file for complete search history.

(56) References Cited

U.S. PATENT DOCUMENTS

| 8,513,735 | B2 * | 8/2013 | Nakata | .............. H01L 29/41758 |
|---|---|---|---|---|
| | | | | 257/331 |
| 8,836,028 | B2 * | 9/2014 | Yedinak | .............. H01L 29/0878 |
| | | | | 257/339 |
| 2014/0235058 | A1 | 8/2014 | Mauder et al. | |
| 2015/0333169 | A1 | 11/2015 | Willmeroth et al. | |
| 2016/0308037 | A1 * | 10/2016 | Sakata | .................... H01L 29/78 |

(Continued)

*Primary Examiner* — Matthew E Warren
(74) *Attorney, Agent, or Firm* — Murphy, Bilak & Homiller, PLLC

(57) ABSTRACT

Disclosed is a transistor device. The transistor device includes: a semiconductor body with an active region and a pad region; at least one transistor cell including a gate electrode dielectrically insulated from a body region by a gate dielectric, wherein the body region is arranged in the active region; an electrode layer arranged above the pad region and dielectrically insulated from the pad region by a further dielectric; and a gate pad arranged above the electrode layer and electrically connected to the electrode layer and the gate electrode of the at least one transistor cell. A thickness of the further dielectric is equal to or less than a thickness of the gate dielectric.

23 Claims, 4 Drawing Sheets

(56) References Cited

U.S. PATENT DOCUMENTS

2016/0379992 A1* 12/2016 Nagao ................. H01L 29/1608
                                                                       257/77
2017/0154984 A1* 6/2017 Eguchi .................. H01L 21/265

\* cited by examiner

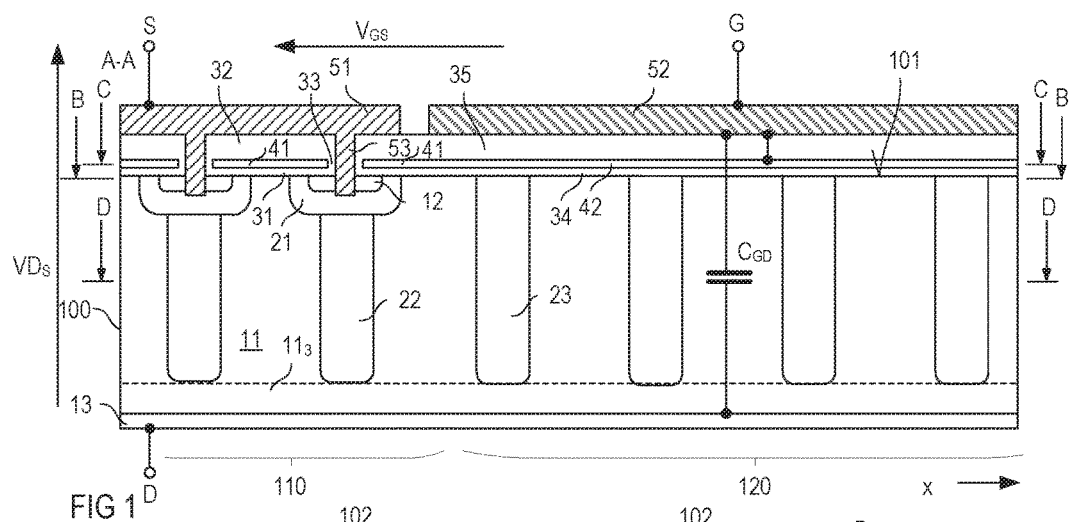
FIG 1
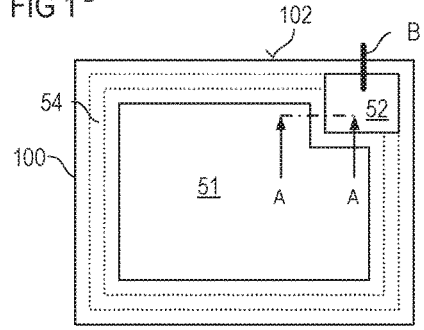
FIG 2
FIG 3
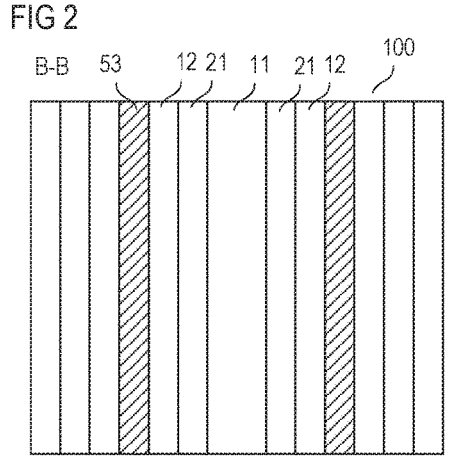
FIG 4A
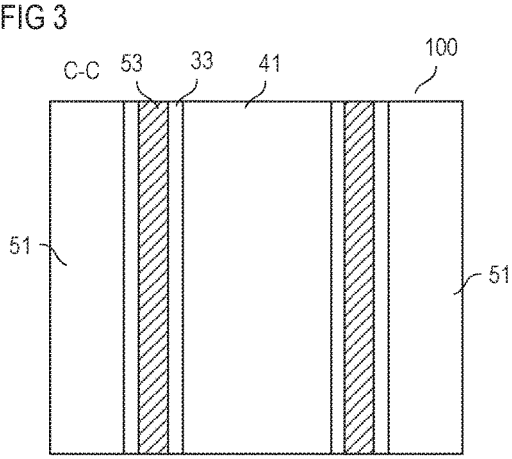
FIG 4B

TRANSISTOR DEVICE WITH INCREASED GATE-DRAIN CAPACITANCE

TECHNICAL FIELD

This disclosure in general relates to a transistor device, in particular a superjunction transistor device.

BACKGROUND

Field-effect controlled transistor devices with an insulated gate electrode are widely used as electronic switches in automotive, industrial, household or consumer electronic applications. These transistor devices are available with voltage blocking capabilities of between several volts and several kilovolts. A field-effect controlled transistor device with an insulated gate electrode includes a source region of a first doping type (conductivity type) in a body region of a second doping type complementary to the first doping type. A drift region of the first conductivity type adjoins the body region and is located between the body region and a drain region. The gate electrode is adjacent the body region, dielectrically insulated from the body region by a gate dielectric, and serves to control a conducting channel in the body region between the source region and the drift region. This type of transistor device is commonly referred to as MOS (Metal Oxide Semiconductor) transistor device although the gate electrode not necessarily includes a metal and the gate dielectric not necessarily include an oxide. Examples of an MOS transistor device include a MOSFET (Metal Oxide Field-Effect Transistors), and an IGBT (Insulated Gate Bipolar Transistors)

One challenge in the design of MOS transistor devices is to achieve a low area-specific on-resistance ($R_{ON} \cdot A$) at a given voltage blocking capability. This area-specific on-resistance is the product of the ohmic resistance ($R_{ON}$) of the transistor device in an on-state and the chip area (A).

With an improvement in the area-specific on-resistance, at a given on-resistance and a given voltage blocking capability, the chip area (chip size) becomes smaller. A reduction of the chip area also results in a reduction of capacitances, such as gate-source capacitances and gate-drain capacitances. Those capacitances affect the switching speed of the transistor device. The switching speed is a measure of how fast the transistor device switches from an on-state to an off-state, and in the other direction. Reduced capacitances cause the transistor device to switch faster. A fast switching of the transistor devices is associated with steep edges of a voltage across the transistor device, a voltage across a load operated by the transistor device, or a current through the transistor device. Those steep edges can be critical with regard to electromagnetic interference.

It may therefore be desirable in a transistor device with a low on-resistance to soften the switching behavior.

SUMMARY

One example relates to a transistor device. The transistor device includes a semiconductor body with an active region and a pad region, at least one transistor cell, an electrode layer, and a gate pad. The at least one transistor cell includes a gate electrode dielectrically insulated from a body region by a gate dielectric, wherein the body region is arranged in the active region. The electrode layer is arranged above the pad region and is dielectrically insulated from the pad region by a further dielectric. The gate pad is arranged above the electrode layer and is electrically connected to the electrode layer and the gate electrode of the at least one transistor cell. A thickness of the further dielectric is equal to or less than a thickness of the gate dielectric.

Those skilled in the art will recognize additional features and advantages upon reading the following detailed description, and upon viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

FIG. 1 shows a vertical cross sectional view of a transistor device including an active region and a pad region, according to one example;

FIG. 2 shows a horizontal cross sectional view of a transistor device of the type shown in FIG. 1, according to one example;

FIG. 3 shows a horizontal cross sectional view of a transistor device of the type shown in FIG. 1, according to another example;

FIGS. 4A-4B show horizontal cross sectional views of sections of one transistor device of the type shown in FIG. 1;

DETAILED DESCRIPTION

Figure 5A:
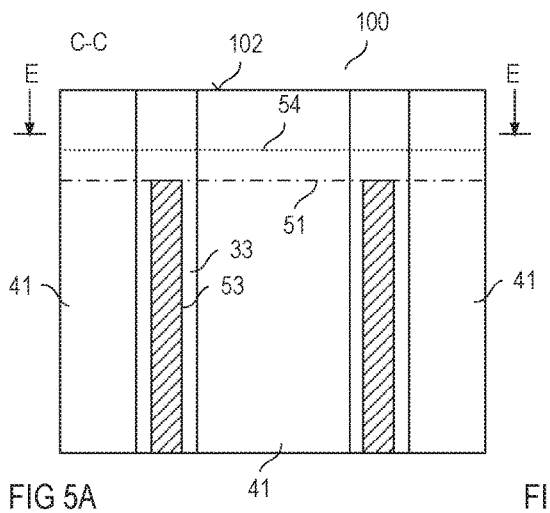
FIGS. 5A-5B show a horizontal cross sectional view (FIG. 5A) and a vertical cross sectional view (FIG. 5B) of one section in an edge region of a transistor device of the type shown in FIG. 1.

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

FIG. 1 shows a vertical cross sectional view of one section of a transistor device according to one example. The transistor device includes a semiconductor body 100 with an active region 110 and a pad region 120. The semiconductor body 100 may include a conventional semiconductor material such as, for example, silicon (Si), silicon carbide (SiC), gallium nitride (GaN), gallium arsenide (GaAs), or the like. In FIG. 1, a section of the active region 110 and an adjoining section of the pad region 120 is shown. In the active region 110 the transistor device includes at least one transistor cell with a gate electrode 41 that is dielectrically insulated from a body region 21 by a gate dielectric 31. The body region 21 is a doped semiconductor region in the active region 110 of the semiconductor body 100. In the example shown in FIG. 1, the gate electrode is arranged above a first surface 101 of the semiconductor body 100. This, however, is only an example. According to another example (not shown) the gate electrode is a trench electrode that is located in a trench extending from a first surface into the semiconductor body.

Referring to FIG. 1, an electrode layer 42 is arranged above the pad region 120 of the semiconductor body 100 and is dielectrically insulated from the pad region 120 by a further dielectric 34. The electrode layer 42 is referred to as pad electrode and the further dielectric layer 34 is referred to as pad dielectric in the following. A gate pad 52 is arranged above the gate electrode layer 42. The gate pad 52 is electrically connected to the pad electrode layer 42 and the gate electrode 41 of the at least one transistor cell. Those connections are only schematically illustrated in FIG. 1. Examples of how those connections between the gate electrode 41 and the gate pad 52 and between the gate pad layer 42 and the gate pad 52 may be implemented are explained further below.

A thickness of the pad dielectric 34 is equal to or less than a thickness of the gate dielectric 31. The thickness of the pad dielectric 34 defines a shortest distance between the pad electrode layer 42 and the first surface 101 of the semiconductor body 100 in the pad region 120. The thickness of the gate dielectric 31 defines the shortest distance between the gate electrode 41 and the body region 21.

The semiconductor device shown in FIG. 1 further includes a drift region 11. The drift region 11 adjoins the body region 21 of the at least one transistor cell and forms a pn-junction with the body region 21. Referring to FIG. 1, the drift region 11 is arranged in the active region 110 and the pad region 120. The drift region 11 is arranged between the body region 21 of the at least one transistor cell and a drain region 13. The drain region 13 may adjoin the drift region 11 (as shown). According to another example (not shown) a field-stop-region of the same doping type as the drift region 11, but more highly doped than the drift region 11 is arranged between the drift region 11 and the drain region 13. Furthermore, the transistor device includes at least one compensation region 22 of a doping type complementary to the doping type of the drift region 11 in the active region 110, and may include at least one compensation region 23 of a doping type complementary to the doping type of the drift region 11 in the pad region 120. In the following, the compensation region 22 in the active region 110 are referred to as first type compensation region, and the compensation region 22 in the pad region 120 is referred to as second type compensation regions. According to one example, the at least one first type compensation region 22 adjoins the body region 21 of the at least one transistor cell. According to one example, the transistor device includes a plurality of transistor cells and each transistor cell includes a compensation region 22 adjoining the body region 21 of the respective transistor cell. In a vertical direction of the semiconductor body 100, which is a direction perpendicular to the first surface 101 the at least one first type compensation region 22 and the optional at least one second type compensation region 23 extends towards the drain region 13. According to one example, the first type compensation region 22 and the second type compensation region are spaced apart from the drain region 13 so that there is a section of the drift region 11 between the first type and the second type compensation regions 22, 23 and the drain region 13.

Referring to FIG. 1, the transistor device further includes a source electrode 51. The source electrode 51 is electrically connected to the source region 12 and the body 21 of the at least one transistor cell. This source electrode 51 forms a source node S or is electrically connected to a source node S of the transistor device. The gate pad 52 forms a gate node G or is electrically connected to a gate node G of the transistor device. The transistor device further includes a drain node D electrically connected to the drain region 13. A drain electrode electrically connected to the drain region 13 may form the drain node D. However, such drain electrode is not explicitly shown in FIG. 1.

The transistor device can be an n-type transistor device or a p-type transistor device. The device type is defined by the doping type of the source region 12. In an n-type transistor device, the source region 11 is an n-type region, the body region 21 is a p-type region, the drift region 11, which has a doping type complementary to the doping type of the body region 21, is an n-type region, the at least one first type compensation region 22 is a p-type region, and the optional at least one second type compensation region 23 is a p-type region. In a p-type transistor device, the source region 12 is a p-type region, the body region 21 is an n-type region, the drift region 11 is a p-type region, the at least one first type compensation region 22 is an n-type region, and the optional at least one second type compensation region 23 is an n-type region. The transistor device can be implemented as MOSFET or an IGBT. In a MOSFET, the drain region 13 has the same doping type as the drift region 11, and in an IGBT the drain region 13 (which may also be referred to as collector region) has a doping type complementary to the doping type of the drift region 11. For example, a doping concentration of the drain region 13 is selected from a range of between 1E18 and 1E19 cm$^{-3}$, doping concentrations of the drift region 11 and the compensation regions 23 are selected from a range of between 1E15 and 5E16 cm$^{-3}$, and a doping concentration of the body region 21 is selected from between 8E16 cm$^{-3}$ and 2E17 cm$^{-3}$.

FIG. 2 shows a top view of the overall transistor device according to one example, and FIG. 3 shows a top view of the overall transistor device according to another example. In each of these examples, the semiconductor body 100 essentially has a rectangular shape. In the example shown in FIG. 2, the gate pad 52 is located adjacent one of four corners of the semiconductor body 100. A bond wire B may be connected to the gate pad 52. The bond wire B may serve to electrically connect the gate pad 52 to other circuit elements (not shown) or to a terminal (not shown) protruding from a housing (package) in which the semiconductor body 100 may be arranged. In the example shown in FIG. 3, the gate pad 52 is spaced apart from the corners of the semiconductor body 100, but still close to an edge 102 of the semiconductor body 100. The "edge" 102 terminates the semiconductor body 100 in lateral directions, which are directions perpendicular to the vertical direction explained above.

FIG. 4A shows a horizontal cross sectional view in a first section plane B-B of one section of the active region 110 of one example transistor device, and FIG. 4B shows a horizontal cross sectional view in a second section plane C-C of one section of the active transistor device 110 of the example transistor device. The first section plane B-B extends through the semiconductor body 100 close to the first surface 101, and the second section plane C-C extends through the gate electrode 51. FIG. 4A shows source regions 12 and body regions 21 of two transistor cells. In this example, the source regions 12 and the body regions 21 are elongated semiconductor regions. The corresponding transistor cells are referred to as elongated transistor cells or stripe cells in the following. Referring to FIG. 1, the source electrode 51 is electrically connected to the source region 12 and the body region 21 of the individual transistor cells by electrode sections that, in the vertical direction, extend through a dielectric layer 32, the gate electrode 41 and the gate dielectric 31 into the semiconductor body 100. The dielectric layer 32 separates the gate electrode 41 from the source electrode 51. The electrode sections 53 are referred to as source vias in the following. In the embodiment shown in FIGS. 4A-4B, these source vias 53, like the source regions 12 and the body regions 21, are elongated source vias. These elongated source vias 53 are dielectrically insulated from the gate electrode 41 by a dielectric 33 and subdivide the planar gate electrode 41 in several elongated gate electrode sections.

Referring to FIG. 5A, which shows a horizontal cross sectional view of one section of the active region 110 in an edge region of semiconductor body 100, the elongated gate electrode 41 sections may extend beyond the source electrode 51 in the lateral direction. The "edge region" of the semiconductor body 100 is a region close to edge 102 of the semiconductor body 100. In FIG. 5A, the source electrode is not shown, as the section plane C-C Which is illustrated in FIG. 5A does not extend through the source electrode 51. However, a position of an outer edge of the source electrode 52 is illustrated by a dashed and dotted line in FIG. 5A. The "outer edge" of the source electrode 51 terminates the source electrode in the lateral directions. In this example, the elongated gate electrode 41 sections are electrically connected to the gate pad 52 through a gate runner 54, which is illustrated in dotted lines in FIGS. 2 and 3. This gate runner 54 may surround the source electrode 51 and is dielectrically insulated from the source electrode 51. The gate runner 54 is out of view in the FIG. 5A, The dotted line labeled with 54 in FIG. 5A represents an inner edge of the gate runner 54, The "inner edge" of the gate runner 54 is an edge of the gate runner that faces the source electrode 51.

Figure 5B:
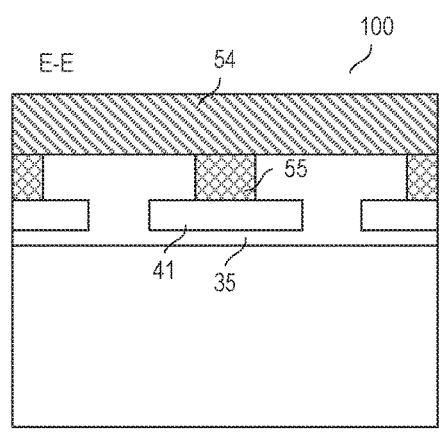

FIG. 5B shows a vertical cross sectional view of the gate runner 54 in a section plane E-E shown in FIG. 5A. Referring to FIG. 5B, the gate runner 54 may be connected to the gate electrode sections 41 by a gate via 55 that, in the vertical direction extend from the gate runner 54 to the individual gate electrode sections 41. Like the source electrode 51 the gate runner 54 can be arranged above the dielectric layer 35, wherein the gate vias 55 extend from the gate runner 54 through this dielectric layer 35 to the individual gate electrode 41 sections. In the same way in which the gate electrode 41 sections are connected to the gate runner 44 the pad electrode layer 42 can be connected to the gate pad 52. That is, the transistor device may include gate vias below the gate pad 52 that extend through the dielectric layer 35 to the electrode layer 42.

The gate runner 44 is optional. In those examples where the gate electrode 41 and the pad electrode layer 42 form a contiguous electrode layer the gate runner 54 can be omitted and it may be sufficient to electrically connect this contiguous electrode layer to the gate pad 52 by gate vias in the pad region 120, that is, by gate vias between the gate pad 52 and the electrode layer 42.

Figure 6A:
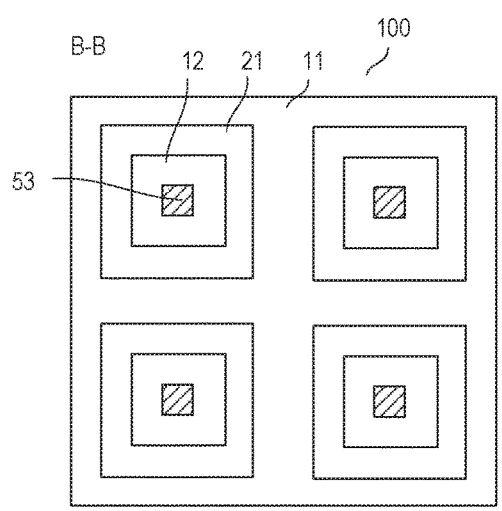
FIGS. 6A-6B show horizontal cross sectional views of sections of one transistor device of the type shown in FIG. 1.
Figure 6B:
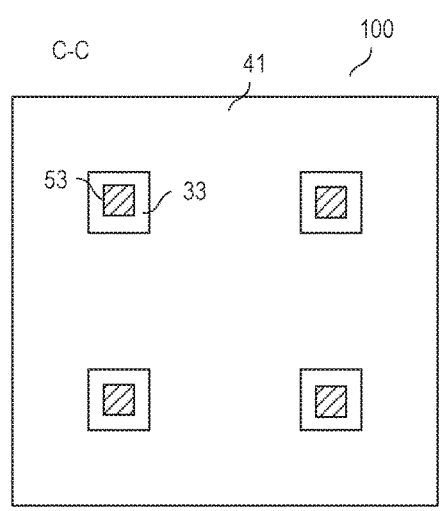

FIGS. 6A-6B show horizontal cross sectional views in section planes B-B and C-C, respectively, of another transistor device. In this transistor device, the body regions 21 and source regions 12 of the individual transistor cells are essentially rectangular in the horizontal plane. The individual source vias 53 are spaced apart from each other such that the gate electrode 41 forms a contiguous electrode layer in the active region 110. The later can be seen from FIG. 6B. The gate electrode 41 adjoins the pad electrode layer 42, for example, as shown in FIG. 1 so that the gate electrode 41 and the pad electrode layer 42 form a contiguous electrode layer. In this transistor device, the gate runner 54 is optional. It should be noted that implementing the body regions 21 and the source regions 12 with a rectangular shape is only one example. Alternative shapes such as a hexagonal shape, any other polygonal shape, or an elliptical shape may be used as well.

One way of operation of the semiconductor device explained herein before is explained in the following. The transistor device can be operated like a conventional MOS transistor. That is, the transistor device can be switched on and off by applying a suitable drive voltage $V_{GS}$ (see FIG. 1) between the gate node G and the source node S. The transistor device is in an on-state when the drive voltage $V_{GS}$ is such that there is a conducting channel in the body region 21 between the source region 12 and the drift region 11. In the on-state of the transistor device, a current can flow between the drain node D and the source node S when a suitable voltage $V_{DS}$ is applied between the drain node D and the source node S. The transistor device is in the off-state when the drive voltage $V_{GS}$ is such that there is no conducting channel in the body region 21 between the source region 12 and the drift region 11. If in the off-state a voltage $V_{DS}$ that reverse biases the pn-junction between the body region 21 and the drift region 11 is applied between the drain node D and the source S that, a space charge region (depletion region) expands in the drift region 11 beginning at the pn-junction. If, for example, the transistor device is an n-type transistor device the pn-junction is reverse biased when a positive voltage $V_{DS}$ is applied between the drain node D and the source node S.

In the off-state, a voltage between the drain node D and the gate node G is different from zero. This causes a gate-drain capacitance $C_{GD}$ of the transistor device to be charged. The "gate-drain capacitance" is a capacitance that is electrically active between the gate node G and the drain node D. A circuit symbol of such gate-drain capacitance $C_{GD}$ is illustrated in FIG. 1. Referring to FIG. 1, this gate-drain capacitance $C_{GD}$ includes the gate pad 52 and the pad electrode layer 42 in the pad region 120 as a first capacitor electrode, the pad dielectric 34 between the electrode layer 42 and the semiconductor body 100 in the pad region 120 as a capacitor dielectric, and the drift region 11 and the drain region 13 in the pad region 120 as a second capacitor electrode. A capacitance value of this gate-drain capacitance $C_{GD}$ is, inter alia, dependent on a size of the area of the pad region 120 and a thickness of the dielectric layer 34. This capacitance value increases as the size of the area increases, and as a thickness of the dielectric layer 34 decreases. By virtue of the pad dielectric 34 having a thickness equal to or lower than the thickness of the gate dielectric 31 a relatively high capacitance value of the gate-drain capacitance $C_{GD}$ can be obtained. According to one example, the thickness is selected from a range of between 20 nanometers (nm) and 200 nanometers, in particular between 80 nanometers and 120 nanometers. A thin pad dielectric is beneficial in view of a soft switching behavior of the transistor device. The higher the capacitance value of the gate-drain capacitance $C_{GD}$ the longer it takes for the gate-drain capacitance $C_{GD}$ to discharge when the transistor device switches from the off-state to the on-state, and the longer it takes for the transistor device to change from the off-state to the on-state. The longer this takes the softer is the switching behavior of the transistor device.

Figure 7:
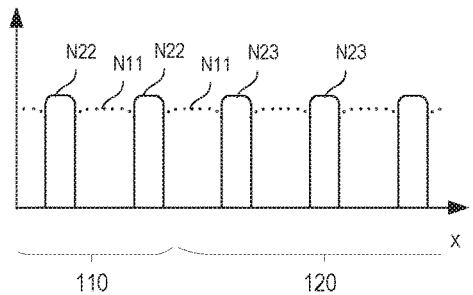
FIGS. 7-9 schematically illustrate doping profiles in the active region and the pad region of transistor devices according to different examples.

In the embodiment shown in FIG. 1, the device structure inside the semiconductor body 100 in the pad region 120 is similar to the device structure in the active region 110 and is only different from the device structure in the active region 110 in that there are no body and source regions in the pad region 120. In this example, a doping concentration N11 of the drift region 11 can be the same in the active region 110 and the pad region 120. Furthermore, doping concentrations N22 of the first type compensation regions 22 may be equal to a doping concentration N23 of the second type compensation regions. This is illustrated in FIG. 7 which schematically illustrates doping concentrations in a horizontal section plane D-D in a first lateral direction x shown in FIG. 1. The doping concentration N11 of the drift region 11 can be selected from the range explained above, and the doping concentrations N22, N23 of the first type compensation regions 23 can be selected from the range explained above.

However, implementing the device structure in the pad region 120 with essentially the same device structure and the same doping parameters as in the active region 110 is only an example. Other examples of how the device structure in the pad region 120 can be implemented are explained with reference to FIGS. 8-19 herein below.

Figure 8:
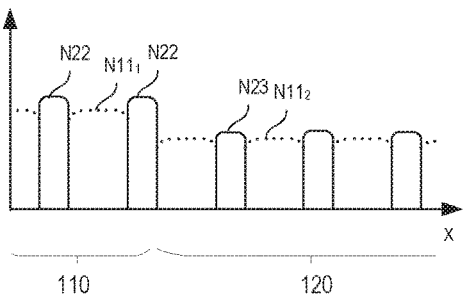

According to one example, shown in FIG. 8, the drift region 11 has a lower doping concentration in the pad region 120 than in the active region 110. In FIG. 8, $N11_1$ denotes the doping concentration in the active region 110, and $N11_2$ denotes the doping concentration in the pad region 120. According to one example, a ratio $N11_1/N11_2$ between the doping concentration $N11_1$ of the drift region 11 in the active region 110 and the doping concentration $N11_2$ of the drift region 11 in the pad region 120 is higher than 1.25, higher than 2.5, higher than 10, or higher than 100. In the example shown in FIG. 8, the doping concentration N23 of the second type compensation regions 23 is below the doping concentration N22 of the first type compensation regions 22. According to one example, a ratio N22/N23 is higher than 2.5, higher than 10, or higher than 100.

Referring to FIG. 1, the drift region 11 includes drift region sections that are arranged between the compensation regions 22 and 23, respectively, and a drift region section $11_3$ that is located between the compensation regions 22, 23 and the drain region 13. According to one example, this drift region section $11_3$ has a lower doping concentration than the drift region 11 between the compensation regions 22 in the active region 110. According to one example, a ratio $N11_1/N11_3$ is between 2 and 10, where $N11_1$ is the doping concentration $N11_1$ in the drift region 11 in the active region 110 and between the compensation regions 22, and $N11_3$ is the doping concentration in the drift region section $11_3$ that is located between the compensation regions 22, 23 and the drain region 13. Referring to FIG. 1, this section $11_3$ with the lower doping concentration may be a contiguous region extending in horizontal directions over the active region 110 and the pad region 120. Such section $11_3$ is only shown in FIG. 1, but may be implemented in each of the examples explained herein.

Figure 9:
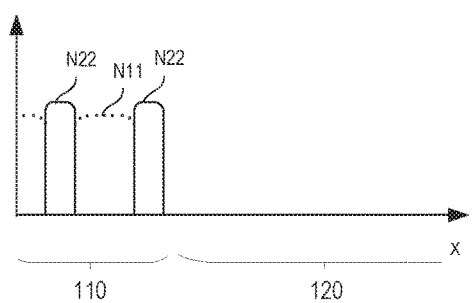

According to another example shown in FIG. 9, the drift region 11 is essentially intrinsic in the pad region 120. That is, an effective doping concentration of the drift region 11 is below 1E13 cm$^{-3}$. The effective doping concentration is given by the difference of an n-type concentration and a p-type concentration. The effective doping concentration of an intrinsic drift region 11 can be an n-type or a p-type doping concentration. According to one example, an intrinsic drift region 11 in the pad region 120 is obtained by providing p-type dopants and n-type dopants with essentially the same doping concentration (so that the difference is less than 1E13 cm$^{-3}$). For example, this doping concentration is higher than 1E15 cm$^{-3}$. Furthermore, there are no second type compensation regions in the pad region 120 in this example.

Figure 10:
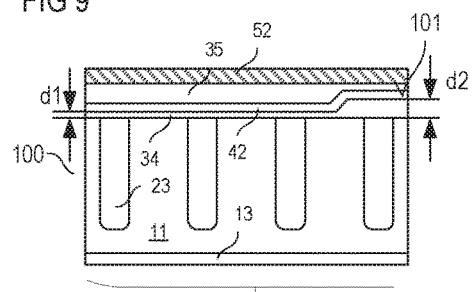
FIG. 10 shows a vertical cross sectional view of one section of the pad region according to one example.
Figure 11:
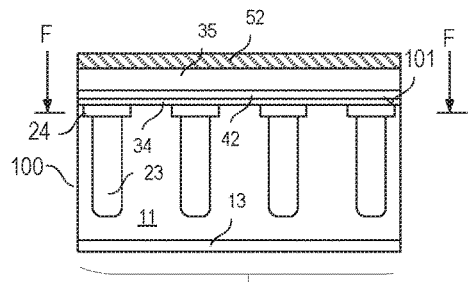
FIG. 11 shows a vertical cross sectional view of one section of the pad region according to another example.

According to one example, shown in FIG. 9, the dielectric layer 34 between the pad electrode layer 42 and the first surface 101 of the semiconductor body 100 may include one or more sections where a thickness of this dielectric layer 34 is higher than in other sections. FIG. 10 shows one section where a thickness of the dielectric layer 34 is d1 and another section where the thickness is d2, where d1<d2. The section with the first thickness is referred to as first section and the section with the second thickness d2 is referred to as second section in the following. The thickness d1 in the first section equals the thickness of the gate dielectric 31 or is lower than the thickness of the gate dielectric 31. The thickness d2 in the second section is higher than the thickness of the gate dielectric 31. According to one example, the thickness d2 is between 1.1 times the thickness of the gate dielectric 31 and 2 micrometers.

According to one example, and as shown in FIG. 1, the first type compensation regions 22 are electrically connected to the source node S via the body regions 21, the source via 53 and the source electrode 51. The second type compensation regions 23 can be floating so that they are not connected to the source node S or the drain node D through a semiconductor region of their doping type. When the transistor device is in the off-state and a voltage $V_{DS}$ is applied between the drain node D and the source node S a space charge region not only expands in the drift region 11 beginning at the pn-junction between the body region 21 and the drift region 11 but also in the drift region 11 and the compensation regions 22, 23 beginning at pn-junctions between the drift region 11 and the compensation regions 22, 23. Thus, in the off-state of the transistor device dopant atoms in the drift region 11 and the compensation regions 22, 23 are ionized. This is equivalent to the compensation region 22, 23 being charged in the off-state of the transistor device. When the transistor device switches from the off-state to the on-state the compensation regions 22, 23 need to be discharged in order for the transistor device to achieve a low on-resistance. The "on-resistance" is the electrical resistance of the transistor device between the drain node D and the source node S in the on-state. The first type compensation regions 22 are discharged by being connected to the source node S. The floating second type compensation regions 23 can only be discharged via the drift region 11. This may take some time and may further delay the transfer from the off-state to the on-state and cause additional electrical losses.

In cases where such delay is not acceptable measures may be taken to promote discharging the second type compensation regions 23 when the transistor device switches from the off-state to the on-state. According to one example, shown in FIG. 11, the transistor device comprises discharge regions 24 of the same doping type as the second type compensation regions 23. These discharge regions adjoin the second type compensation regions 23 and may be arranged between the second type compensation regions 23 and the first surface 101 of the semiconductor body 100. These discharge regions 24 have a higher doping concentration than the second type compensation region 23. For example, a doping concentration of these discharge regions 14 is selected from between 8E16 cm$^{-3}$ and 2E17 cm$^{-3}$.

Figure 12:
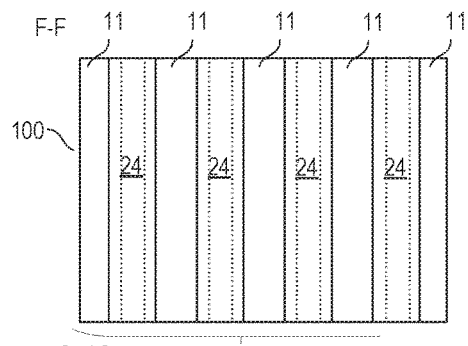
FIGS. 12-15 show horizontal cross sectional views of different examples of a pad region of the type shown in FIG. 11.

FIG. 12 shows a horizontal cross sectional view in a section plane F-F that extends through the discharge regions 24. A position of the second type compensation regions 23 below the discharge regions 24 is illustrated in dotted lines in FIG. 12, as well as in FIGS. 13-15 explained below. In this example, the second type compensation regions 23 are elongated regions. The discharge regions 24 are elongated semiconductor regions as well and may extend along a complete length of the individual second type compensation regions 23.

Figure 13:
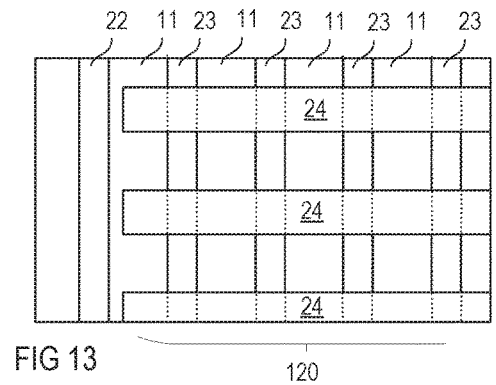

FIG. 13 shows a horizontal cross sectional view of one section of the pad region 120 of a transistor device according to another example. In this example, the second type compensation regions 23, like in the example shown in FIG. 12, are elongated semiconductor regions. The discharge regions 24 are also elongated semiconductor regions, but extend across the second type compensation regions 23. That is, angles between the second type compensation regions 23 and the discharge regions 24 are different from zero. In the example shown in FIG. 13, these angles are essentially right angles. However, this is only an example. Any angles between 0° and 90°, in particular between 45° and 90° may be used.

Figure 14:
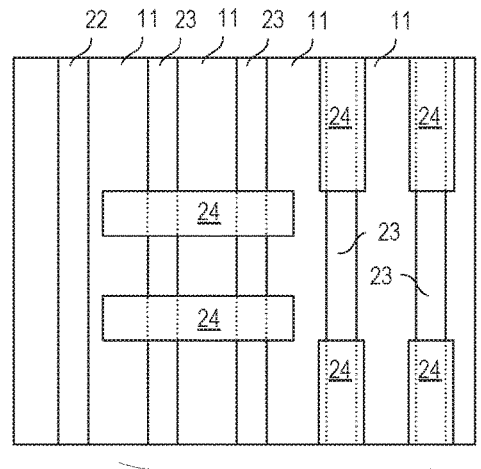

FIG. 14 shows an example that combines the examples shown in FIGS. 12 and 13. In the example shown in FIG. 14 the transistor device includes several discharge regions 24 that each extend along an associated one of the second type compensation regions 23, and several discharge regions 24 that extend across second type compensation regions 23. In general, there is at least one discharge region 24 that extends along at least a part of the length of an associated second type compensation region 23, and there is at least one discharge region 24 that extends across two or more associated second type compensation regions 23.

Figure 15:
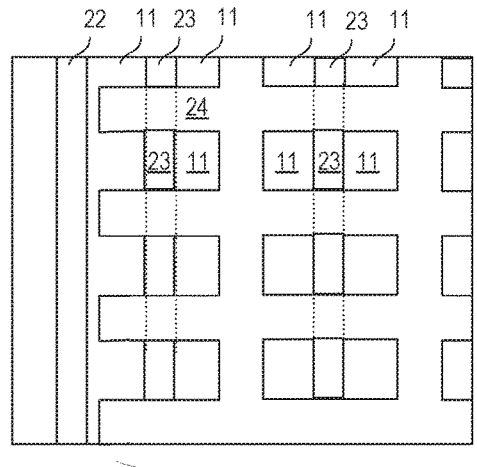

FIG. 15 shows another example of a discharge region 24. In this example, the discharge region 24 has a grid shape so that sections of the discharge region 24 extend along second type compensation regions 23 and other sections extend across second type compensation regions 23.

Figure 16:
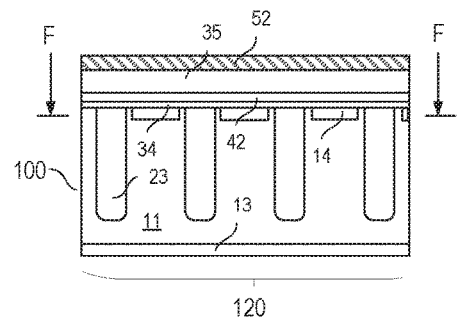
FIG. 16 shows a vertical cross sectional view of a pad region according to another example.
Figure 17:
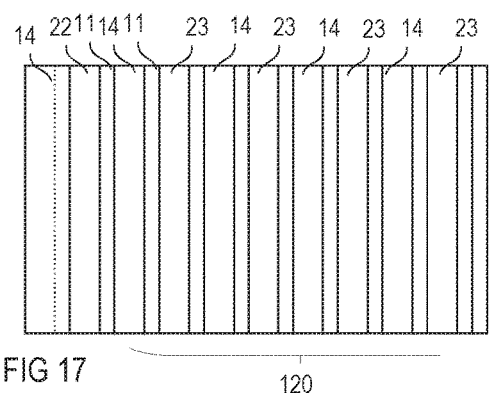
FIG. 17 shows a horizontal cross sectional view of a pad region of the type shown in FIG. 16.

FIG. 16 shows a vertical cross sectional view of a transistor device according to another example. In this example, the transistor device includes discharge regions 14 of the same doping type as a drift region 11, but more highly doped than the drift region 11. For example, a doping concentration of these discharge regions 14 is selected from between 8E16 cm$^{-3}$ and 2E17 cm$^{-3}$. These discharge regions 14 may adjoin the first surface 101 in the pad region 120 and are adjacent the compensation regions 23. FIG. 17 shows a horizontal cross sectional view in a section plane F-F of one example transistor device of the type shown in FIG. 16, In this example, the discharge regions 14 are elongated regions that extend essentially parallel to elongated second type compensation regions 23. In the on-state of the transistor device, these discharge regions 14 at least in a region close to the active region 110 may carry a portion of the load current and, therefore, may help to reduce the on-resistance.

Figure 18:
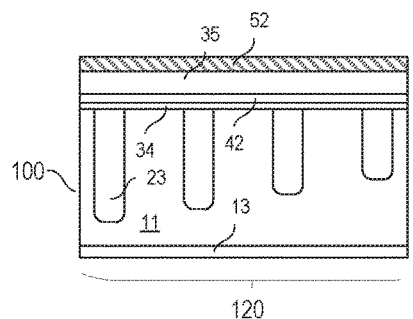
FIG. 18 shows a horizontal cross sectional view of a pad region according to one example.

FIG. 18 shows a vertical cross sectional view of a transistor device according to another example. In this example, the second type compensation regions 23 in the pad region 120 have different lengths. A "length" of one second type compensation region 23 is a dimension of the second type compensation region 23 in the vertical direction of the semiconductor body (that is, in a direction perpendicular to the first surface 101). According to one example, the longer a distance in the lateral direction between a second type compensation region 23 and the active region 110 the shorter the length of the respective compensation region 23. That is, lengths of the individual second type compensation regions 23 decrease towards a center of the pad region 120. The "center of the pad region 120" is a section of the pad region 120 that is most distant to the active region 110.

Figure 19:
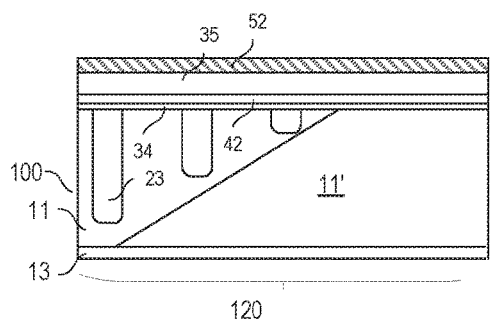
FIG. 19 shows a vertical cross sectional view of a pad region according to yet another example.

FIG. 19 shows a vertical cross sectional view of one section of the pad region 120 according to another example. In this example, the pad region 120 includes a section 11' of the drift region 11 where the compensation regions 23 are omitted. A doping concentration of this region 11' may be equal the doping concentration $N11_1$ of the drift region 11 between the compensation regions 22 in the active region 110, or may be higher than $N11_1$ such as, for example, between 1E15 cm$^{-3}$ and 1E17 cm$_{-3}$. The semiconductor body 100 may include a lower doped section 11$_3$ explained with reference to FIG. 1 between drift region section 11' and the drain region 13. However, such section 11$_3$ is not shown in FIG. 19.

The drift region section 11' may adjoin the drain region 13 on one side and the first surface 101 on the other side. By virtue of the missing compensation regions 23 and/or the higher doping concentration the drift region section 11' cannot be totally depleted in the off-state of the transistor device and acts as part of the second capacitor electrode and helps to further increase the capacitance value of the gate-drain capacitance $C_{GD}$. Between this higher doped 11' and the active region 110 the pad region 120 includes a section of the drift region 11 that may have the same doping concentration than the drift region 11 in the active region 110, or a doping concentration between the doping concentration of the drift region 11 in the active region and the doping concentration of the higher doped region. Furthermore, the transistor device may include compensation regions 23 with different lengths in this section between the higher doped region 11 ' and the active region 110. A length of these second type compensation regions 23 may decrease towards the higher doped region 11'. In the higher doped region 11' there are no compensation regions in this example. The second type compensation regions 23 and the drift region 11 section in which the second type compensation regions 23 are embedded act as an edge termination which in the off-state of the transistor device absorbs a voltage difference between the electrical potential of the higher doped region 11' and the electrical potential of the drift region 11. In the off-state, the electrical potential of the higher doped region 11' essentially equals the electrical potential of the drain node D, while in the drift region 11 in the active region 110 the electrical potential varies in the vertical direction of the transistor device between source potential in a region close to the first surface 101 and drain potential in a region close to the drain region 13 so that, in particular close to the first surface 101 there is a voltage between the active region 110 and the higher doped region 11' which the edge termination structure absorbs.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor device, comprising:
   a semiconductor body with an active region and a pad region;
   at least one transistor cell comprising a gate electrode dielectrically insulated from a body region by a gate dielectric, wherein the body region is arranged in the active region;
   an electrode layer arranged above the pad region and dielectrically insulated from the pad region by a further dielectric;
   a gate pad arranged above the electrode layer and electrically connected to the electrode layer and the gate electrode of the at least one transistor cell, wherein a thickness of the further dielectric is equal to or less than a thickness of the gate dielectric,
   a drift region in the active region and the pad region of the semiconductor body, wherein the drift region forms a pn-junction with the body region of the at least one transistor device;
   at least one first type compensation region in the active region, wherein the at least one first type compensation region adjoins the drift region, and has a doping type complementary to a doping type of the drift region; and
   a plurality of second compensation regions in the pad region, wherein the plurality of second type compensation regions adjoins the drift region, and has a doping type complementary to a doping type of the drift region,
   wherein a doping concentration of the plurality of second type compensation regions is lower than a doping concentration of the at least one first type compensation region,
   wherein a doping concentration of at least some of the plurality of second compensation regions is dependent on a distance between the respective compensation region and the active region, wherein the longer the distance, the lower the doping concentration.

2. The transistor device of claim 1, further comprising a plurality of transistor cells each comprising a body region arranged in the active region of the semiconductor body.

3. The transistor device of claim 1, wherein the at least one transistor cell further comprises a source region separated from the drift region by the body region, and a drain region separated from the body region by the drift region.

4. The transistor device of claim 3, further comprising a doped region of the same doping type as the drift region and having a higher doping concentration than the drift region, wherein the doped region adjoins the drift region in the pad region.

5. The transistor device of claim 1, wherein the at least one first type compensation region adjoins the body region of the at least one transistor cell.

6. The transistor device of claim 1, wherein a shape and a doping concentration of the at least one of the plurality of second type compensation regions equals a shape and a doping concentration of the at least one first type compensation region.

7. The transistor device of claim 1, wherein a doping concentration of the drift region in at least one section of the pad region is lower than a doping concentration of the drift region in the active region.

8. The transistor device of claim 1, wherein a doping concentration of the drift region in the pad region equals a doping concentration of the drift region in the active region.

9. The transistor device of claim 1, wherein the drift region in at least one section of the pad region has a higher doping concentration than the drift region in the active region.

10. A transistor device, comprising:
    a semiconductor body with an active region and a pad region;
    at least one transistor cell comprising a gate electrode dielectrically insulated from a body region by a gate dielectric, wherein the body region is arranged in the active region;
    an electrode layer arranged above the pad region and dielectrically insulated from the pad region by a further dielectric;
    a gate pad arranged above the electrode layer and electrically connected to the electrode layer and the gate electrode of the at least one transistor cell, wherein a thickness of the further dielectric is equal to or less than a thickness of the gate dielectric,
    a drift region in the active region and the pad region of the semiconductor body, wherein the drift region forms a pn-junction with the body region of the at least one transistor device;
    at least one first type compensation region in the active region, wherein the at least one first type compensation region adjoins the drift region, and has a doping type complementary to a doping type of the drift region; and
    a plurality of second compensation regions in the pad region, wherein the plurality of second type compensation regions adjoins the drift region, and has a doping type complementary to a doping type of the drift region,
    wherein a vertical length of at least one of the plurality of second type compensation regions is lower than a vertical length of the at least one first type compensation region.

11. The transistor device of claim 10, wherein a doping concentration of the drift region in the pad region equals a doping concentration of the drift region in the active region.

12. The transistor device of claim 10, wherein the drift region in at least one section of the pad region has a higher doping concentration than the drift region in the active region.

13. The transistor device of claim 10, wherein the at least one transistor cell further comprises a source region separated from the drift region by the body region, and a drain region separated from the body region by the drift region.

14. The transistor device of claim 10, wherein a vertical length of at least some of the plurality of second type compensation regions is dependent on a distance between the respective compensation region and the active region, wherein the longer the distance, the lower the vertical length.

15. The transistor device of claim 10, further comprising an edge termination structure in the pad region between the active region and the at least one section of the pad region.

16. The transistor device of claim 15, wherein the edge termination structure comprises at least one compensation region adjoining the drift region and having a doping type complementary to a doping type of the drift region.

17. The transistor device of claim 16, further comprising a plurality of compensation regions, wherein a vertical length of at least some of the plurality of compensation regions is dependent on a distance between the respective compensation region and the active region, wherein the longer the distance, the lower the vertical length.

18. A transistor device, comprising:
a semiconductor body with an active region and a pad region;
at least one transistor cell comprising a gate electrode dielectrically insulated from a body region by a gate dielectric, wherein the body region is arranged in the active region;
an electrode layer arranged above the pad region and dielectrically insulated from the pad region by a further dielectric;
a gate pad arranged above the electrode layer and electrically connected to the electrode layer and the gate electrode of the at least one transistor cell, wherein a thickness of the further dielectric is equal to or less than a thickness of the gate dielectric,
a drift region in the active region and the pad region of the semiconductor body, wherein the drift region forms a pn-junction with the body region of the at least one transistor device;
at least one first type compensation region in the active region, wherein the at least one first type compensation region adjoins the drift region, and has a doping type complementary to a doping type of the drift region;
at least one second type compensation region in the pad region, wherein the at least one second type compensation region adjoins the drift region, and has a doping type complementary to a doping type of the drift region; and
a discharge region of the same doping type as the at least one second type compensation region and more highly doped than the at least one second type compensation region, wherein the discharge region adjoins the at least one second type compensation region.

19. The transistor device of claim 18, wherein a doping concentration of the drift region in the pad region equals a doping concentration of the drift region in the active region.

20. The transistor device of claim 18, wherein the drift region in at least one section of the pad region has a higher doping concentration than the drift region in the active region.

21. The transistor device of claim 18, wherein the at least one transistor cell further comprises a source region separated from the drift region by the body region, and a drain region separated from the body region by the drift region.

22. The transistor device of claim 18, wherein the discharge region extends to or into the active region.

23. The transistor device of claim 18, wherein the discharge region adjoins a surface of the semiconductor body in the pad region.

* * * * *